United States Patent [19]

Leung

[11] Patent Number: 4,729,815

[45] Date of Patent: Mar. 8, 1988

[54] MULTIPLE STEP TRENCH ETCHING PROCESS

[75] Inventor: Howard K. H. Leung, Austin, Tex.

[73] Assignee: Motorola, Inc., Schaumburg, Ill.

[21] Appl. No.: 887,597

[22] Filed: Jul. 21, 1986

[51] Int. Cl.$^4$ .................. B44C 1/22; H01L 21/308
[52] U.S. Cl. .................. 156/643; 156/646; 156/648; 156/651; 156/659.1; 156/662
[58] Field of Search .............. 156/643, 646, 648, 651, 156/653, 659.1, 661.1, 662; 29/576 W; 148/DIG. 161

[56] References Cited

U.S. PATENT DOCUMENTS

| | | | |
|---|---|---|---|
| 3,412,295 | 11/1968 | Grebene | 29/576 W |
| 4,484,979 | 11/1984 | Stocker | 156/643 |
| 4,495,025 | 1/1985 | Haskell | 29/576 W X |
| 4,529,475 | 7/1985 | Okano et al. | 156/643 |
| 4,534,826 | 8/1985 | Goth et al. | 156/643 |
| 4,578,128 | 3/1986 | Mundt et al. | 156/643 X |

FOREIGN PATENT DOCUMENTS

| | | | |
|---|---|---|---|
| 57-12533 | 1/1982 | Japan | 29/576 W |
| 58-130529 | 8/1983 | Japan | 156/643 |
| 61-32525 | 2/1986 | Japan | 156/643 |

OTHER PUBLICATIONS

Clark, "Reactive Ion-Etch Process for Etched Sidewall Tailoring", IBM TDB, vol. 19, No. 11, Apr. 1977.

Primary Examiner—S. Leon Bashore
Assistant Examiner—Andrew J. Anderson
Attorney, Agent, or Firm—John A. Fisher; Jeffrey Van Myers; David L. Mossman

[57] ABSTRACT

A process having three steps to etch a vertical trench with rounded top corners and rounded bottom corners. The first step involves anisotropically etching a vertical trench through an opening in a masking layer to approximately 85 to 90% of the final trench depth to give a trench with sharp or abrupt top corners and sharp bottom corners. The second step rounds the top corners and the third step extends the trench depth and provides rounded bottom corners. Using CHF$_3$ as an etch species and adjusting the DC bias differently for each step gives better profile control and better critical dimension (CD) control.

15 Claims, 4 Drawing Figures

MULTIPLE STEP TRENCH ETCHING PROCESS

FIELD OF THE INVENTION

The invention relates to processes for etching semiconductor substrates and structures and more particularly relates to processes for etching trenches in semiconductor structures.

BACKGROUND OF THE INVENTION

In the quest to produce integrated circuits bearing an ever-increasing number of devices, such as in the production of a four megabit memory, one common understanding is that many planar devices and structures need to be changed to three-dimensional structures, such as vertical structures built upward from the surface of the semiconductor substrate of built down into trenches etched into the substrate. Thus, considerable effort has been devoted to developing trench isolation, trench resistors, trench capacitors and trench transistors. In order to fabricate these trench devices, silicon etching technology must be developed to reproducibly etch narrow, vertical steps.

In developing a completely dry silicon etch process, several important issues must be considered. The etch process must provide a fast etch rate, good uniformity from etch to etch and across the wafer, excellent critical dimension (CD) control and a smooth rounded profile. A survey of current literature reveals that the most common chemistry employed for trench etching of less than one micron (um) in depth is nitrogen trifluoride, $NF_3$, or $NF_3$ in an inert mixture. For etching of deeper trenches, such as on the order of 3 $\mu m$, chlorinated or brominated plasmas are used. Although considerable information has been published about etch rate, selectivity, etc., little emphasis has been placed by researchers on the exact etch profile, particularly the rounding of trench corners at the top of the trench, trench profile control and CD control.

With respect to miniature capacitors in particular, as device geometries begin to shrink, it becomes increasingly difficult to provide capacitors with high unit capacitance that are not adversely affected by edge effects. Edge effects occur when the electric fields in the storage plates tend to concentrate around the abrupt edges of the structures. The increased electric field can result in premature electrical failure of the capacitor or relatively high field induced leakage currents which undesirably discharge the capacitor.

Avoiding sharp or abrupt geometrical device features is relatively easy for planar capacitors; however, for some of the proposed trench capacitor structures, the features must follow the trench contours which are convoluted and cause sharp edges at the points of directional changes. While these issues are known, most trench etching processes devised are one-step procedures which only address a few of these considerations. A number of trench etching processes have been developed which will produce a generally vertical trench, even with curved or rounded bottom edges. However, no process seems to address rounding the top edges of the trench over which the device features must also be formed.

SUMMARY OF THE INVENTION

Accordingly, it is an object of the present invention to provide a process for etching trenches in semiconductor material that produces a trench with substantially vertical sidewalls at least 3 $\mu m$ deep.

Another object of the invention is to provide a trench etching process that will produce a deep trench having rounded top and bottom corners.

It is another object of the present invention to provide a process for etching trenches in semiconductor material that provides good critical dimension control.

In carrying out these and other objects of the invention, there is provided, in one form, a process for etching trenches with rounded corners in a semiconductor substrate involving a sequence of steps. A first etch is performed through an opening in a mask layer on the semiconductor substrate to form a preliminary trench with sharp top corners and sharp bottom corners. Next, a second etch is conducted to etch the sharp corners of the trench into rounded top corners. Finally, a third etch is performed to further extend the depth of the trench beyond the preliminary trench and forming rounded bottom corners.

DETAILED DESCRIPTION OF THE INVENTION

A three-step silicon trench etch process that focuses on the rounding of the sharp corners of the trench, CD control and profile control has been discovered. In order to achieve reasonable throughput and also to satisfy all trench etch requirements, a batch mode etch with multi-step capability may be employed.

In the first step, nitrogen trifluoride, $NF_3$, and Freon 23, $CHF_3$, are used to give an anisotropic etch to achieve a preliminary trench having a preliminary depth approximately 85 to 90% of the final trench depth. While all of the trench etch steps employ aspects of both physical and chemical etching, the first step is more of a chemical etch. The mechanism here involves the sidewall passivation of the trench by polymer formation from the $CHF_3$. This way, silicon will be preferentially removed in the vertical direction resulting in less undercutting and better CD control.

The rounding of the top trench corners utilizes the same mixture as in the first step with the exception of an increased absolute DC bias value on the etcher. This produces an etch that is more physical action than chemical action. The mechanism here is one of etching back the mask to create a step-wise tapering of the silicon close to the mask. Finally, a third step using only nitrogen trifluoride at a lower absolute DC bias will round out the bottom corners while simultaneously extending the trench depth another 10 to 15%. This final step is again more of a chemical etch similar to the first step. The three-step process has been shown to provide the desired trench characteristics for deep trenches of about three microns. As might be expected from the amounts of material removed, the first step is relatively long while the second and third steps are relatively short.

The three-step process will now be described in more detail with reference to the drawings and an actual example. The goal was to fabricate a trench 3.0 μm deep and 1.4×2.0 μm in area. An AME batch etcher was used that can accommodate 18 125 mm wafers/batch.

Figure 1:
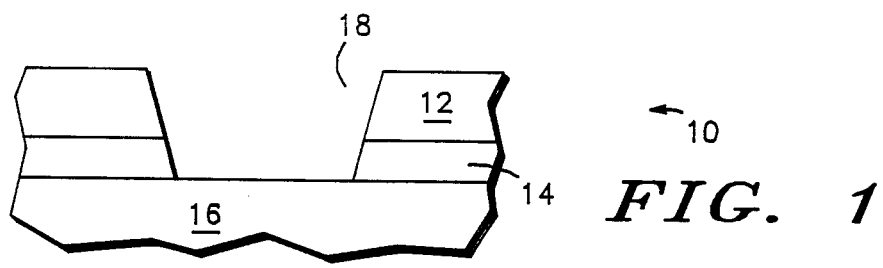
FIG. 1 is a sectional illustration of a semiconductor substrate bearing two masking layers having an opening formed therein.

Shown in FIG. 1 is a trench capacitor 10 under construction illustrating two mask layers, top mask layer 12 and bottom mask layer 14 on a semiconductor substrate 16. The inventive process may be done with one mask. The top mask, for etch purposes, is optional. It will be appreciated by those skilled in the art that semiconductor substrate 16 may be of any suitable semiconductor material such as mono- or even polycrystalline silicon and in turn, the mask layers 12 and 14 may be of any suitable material that will perform the functions described herein. For the purposes of illustration only, top layer 12 will be taken to be a layer of photoresist and bottom layer 14 will be taken to be silicon dioxide. As seen in FIG. 1, an opening 18 has already been created in top layer 12 as well as in bottom layer 14, substrate 16 is ready for the trench etching process. It should be noted that the thicknesses of the layers in the FIGS. are exaggerated for clarity, and the proportions of the trench are not true to the actual trenches formed, as described in this example. Of course, one skilled in the art may desire to change the proportions of the trench or round the corners more or less than described in this example, which would not be outside the scope of this invention.

Figure 2:
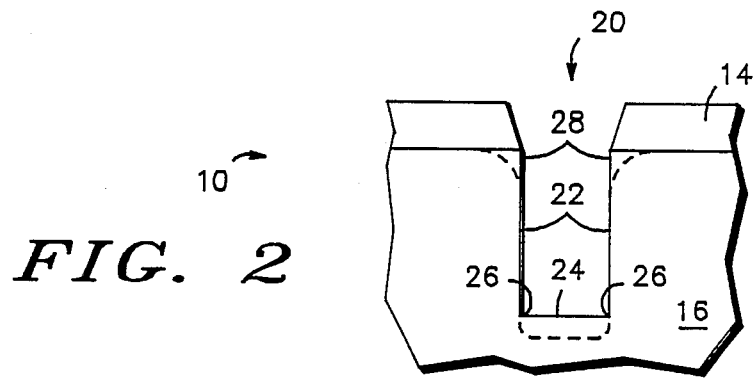
FIG. 2 is a sectional illustration of a preliminary trench etched through the opening seen in FIG. 1 after the first etch step of the invention.

The first etch step is an anisotropic etch to form a preliminary trench to a preliminary depth of approximately 85 to 90% of the final desired depth of the trench using an etch chemistry of 20 standard cubic centimeters/minute (sccm) of $NF_3$ and 20 sccm of $CHF_3$ at a pressure of 40 mTorr and −210 V DC bias on the etcher. These conditions gave a silicon etch rate of 250 angstroms/min, a silicon:photoresist etch selectivity of 3:1, a silicon:oxide etch selectivity of 2:1 and a uniformity of ±5%. The DC bias range for this step is approximately −210 to −250 volts and the proportions of $NF_3$ to $CHF_3$ should be approximately equal. Under these conditions, the preliminary vertical trench 20 shown in FIG. 2 has substantially vertical sidewalls 22, a flat preliminary trench bottom 24 with sharp bottom corners 26 and sharp top corners 28. It is also noted that top mask layer 12 is etched away in this step, if it is of photoresist material.

The formation of $CHF_3$ polymer on the trench surfaces 22 and 24 assists in maintaining a uniform vertical etch by remaining on the sides 22 but being constantly removed from the bottom 24, thereby offering additional direction to the etch. The final, desired etch profile is superimposed over the profile of FIG. 2 for comparison. Ideally, a single-step etch process would give the desired profile, but the applicant has discovered that the desired profile requires three steps, although all steps may be performed one after the other in a single etcher without moving the substrate 16.

Figure 3:
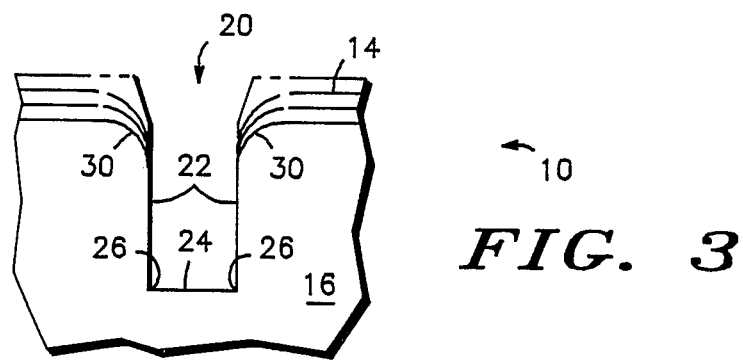
FIG. 3 is a sectional illustration of the preliminary trench of FIG. 2 illustrating the rounding of the top corners of the trench in accordance with the second etch step of the invention.

Shown in FIG. 3 shows the result of the second etch step which is conducted under the same conditions as the first etch, except that the DC bias is increased to −400 V DC which gives an isotropic etch of silicon at 360 angstroms/minute, a Si:photoresist etch selectivity of 2:1 and a Si:oxide selectivity of 1.5:1 with an etch uniformity of ±5%. The DC bias may actually range from about −300 to −400 volts. Again, the proportions of $NF_3$ to $CHF_3$ should be approximately equal. The second step causes etching action laterally at the surface which removes bottom masking layer 14 and etches down sharp top corners into rounded top corners 30 gradually over the profiles shown in dashed lines. The rounded top corners 30 actually have a very minute step pattern indicating a diffusion-limited surface reaction. This minute step pattern starts the corner rounding with the bottom masking layer 14, but continues it into the substrate 16.

Figure 4:
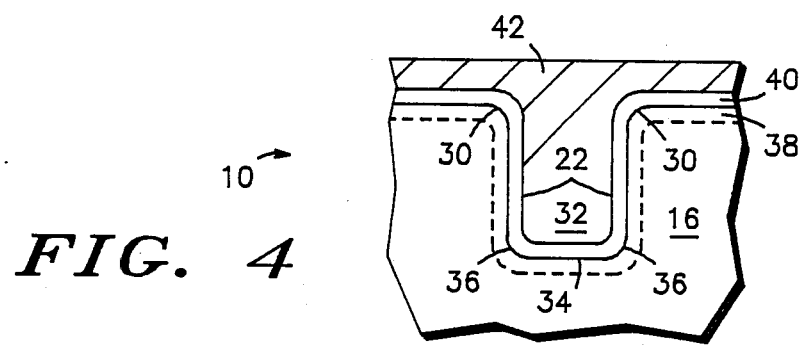
FIG. 4 is a sectional illustration of a finished trench capacitor showing the finished trench profile obtained after the third etch step of the process of the invention.

The final step of the etch process of this invention is directed to extending the bottom of the trench and rounding the bottom corners. Freon 23 ($CHF_3$) is not used in the etch mixture. The $NF_3$ flow rate remains 20 sccm and the pressure 40 mTorr, but the etcher power is now 400 W. This is equivalent to reducing the absolute DC bias to approximately the same level as in the first step. Power and DC bias control essentially the same etcher parameter and on an etcher equipped with both, as here, one or the other is set but not both. That is, when the DC bias or the power is set, the other control, power or DC bias is not and can not be independently set. Etcher power may be in the range of 400 to 500 W. These conditions give a silicon etch rate of 740 angstroms/min, a silicon:photoresist etch selectivity of 6:1, a silicon:oxide etch selectivity of 7:1 with an etch uniformity of ±5%. The result is the desired etch profile as shown in the form of capacitor 10 in FIG. 4. It is desirable to etch the bottom of the trench 34 last, after the second step of rounding the top corners 30, to clean the bottom of the trench 32 from any debris that may have accumulated prior to device formation. Such debris may interfere with the operation of the device if it is appreciable.

The final trench 32 has a final trench bottom 34 with rounded bottom corners 36. The other elements of capacitor 10, which is only one example of the type of feature that can be placed in trench 32, include doping layer 38 which serves as one plate of the capacitor, dielectric layer 40, such as silicon dioxide and conductive plug 42, which serves as the other plate of the capacitor and may be a doped semiconductor material such as polysilicon.

In summary, the addition of $CHF_3$ to the first two steps gives better profile and better CD control. That is, the profile and CD that results is closer to what it is designed to be than previous processes. Changes in the DC bias contribute to the etching action obtained. The three-step etch process achieved the desired trench depth with rounded top and bottom corners thereby avoiding the problems sharp or abrupt corners cause in devices such as capacitors. No extra steps outside of the etcher are required and each of the steps may be accomplished one right after the other within the same etcher.

I claim:

1. A process for etching trenches with rounded corners in a semiconductor substrate comprising the sequence of steps of:

performing a first etch using $NF_3$ and $CHF_3$ etch species at a first DC etch bias, to form a preliminary trench having sharp top corners and sharp bottom corners;

performing a second etch using $NF_3$ and $CHF_3$ as etch species at a second DC etch bias higher than said first DC etch bias, to etch the sharp corners of the trench into rounded top corners; and performing a third etch using only $NF_3$ as etch species, to further extend the depth of the trench while forming rounded bottom corners.

2. The process of claim 1 wherein the three etch steps are all performed in the same piece of equipment.

3. The process of claim 1 wherein the etch steps all have a chemical mechanism at work and a physical mechanism at work, and in the first and third etch steps the chemical mechanism predominates and in the second etch step the physical mechanism predominates.

4. The process of claim 1 wherein the first etch step is anisotropic and the second etch step is isotropic.

5. The process of claim 1 wherein the semiconductor substrate is silicon and a silicon dioxide masking layer is present over the surface of the semiconductor substrate prior to the first etch.

6. The process of claim 1 wherein the etching occurs within an etcher having variable DC bias, and the absolute DC bias of the second etch step is greater than the absolute DC bias of the first and third steps.

7. The process of claim 1 wherein the first etch step uses $NF_3$ and $CHF_3$ as etch species at a DC bias voltage of from about $-210$ to $-250$ volts, the second etch step uses $NF_3$ and $CHF_3$ as etch species at a DC bias voltage of $-300$ to $-400$ volts and the third etch step uses only $NF_3$ as etch species at a power of about 400 W.

8. The process of claim 1 wherein the first etch anisotropically etches the preliminary trench approximately 85 to 90% the depth of the finished trench.

9. A process for plasma etching trenches in a semiconductor substrate comprising the steps of:
forming a masking layer over a surface of the semiconductor substrate;
forming an opening in the masking layer to expose a selected portion of the semiconductor substrate surface;
performing a first plasma etch using $NF_3$ and $CHF_3$ as etch species at a first DC etch bias, of the semiconductor substrate through the opening anisotropically forming a preliminary trench having sharp top corners and sharp bottom corners;
performing a second plasma etch using $NF_3$ and $CHF_3$ as etch species at a second DC etch bias higher than said first DC bias, of the semiconductor substrate to etch the top corners of the preliminary trench providing rounded top corners; and
performing a third plasma etch using only $NF_3$ as species of the semiconductor substrate further extending the depth of the trench while forming rounded bottom corners providing a finished trench profile having rounded corners.

10. The process of claim 9 wherein the semiconductor substrate is silicon and the masking layer is silicon oxide.

11. The process of claim 9 wherein the etching occurs within an etcher having variable DC bias, and the first etch step has a first DC bias, the second etch step has a second DC bias and the third etch step has a third DC bias wherein the second DC bias is greater than the first DC bias and the third DC bias is approximately equal to the first DC bias.

12. The process of claim 9 wherein the first etch step uses $NF_3$ and $CHF_3$ as etch species at a DC bias voltage of from about $-210$ to $-250$ volts, the second etch step uses $NF_3$ and $CHF_3$ as etch species at a DC bias voltage of $-300$ to $-400$ volts and the third etch step uses only $NF_3$ etch species at a power of about 400 W.

13. The process of claim 9 wherein the first plasma etch anisotropically etches the preliminary trench approximately 85 to 90% the depth of the finished trench.

14. A process for plasma etching trenches having rounded corners in a silicon substrate comprising the steps of:
forming a top masking layer of a photoresist material and a bottom masking layer of silicon dioxide over a surface of the silicon substrate;
forming an opening in the top masking layer and bottom masking layer to expose a selected portion of the silicon substrate surface;
performing a long first plasma etch of the silicon substrate through the opening anisotropically using $NF_3$ and $CHF_3$ as etch species at a first DC bias voltage, forming a preliminary trench having sharp top corners and sharp bottom corners and a depth of from 85 to 95% of the depth of the finished trench, and removing the top masking layer;
performing a short second plasma etch of the silicon substrate using $NF_3$ and $CHF_3$ as etch species at a second DC bias voltage higher than said first DC bias voltage to etch away edges of the bottom mask layer while etching the top corners of the preliminary trench providing a rounded profile; and
performing a short third plasma etch of the silicon substrate using $NF_3$ only as etch species at a third DC bias voltage lower than said second DC bias voltage, further extending the depth of the trench while forming rounded bottom corners providing a finished trench profile having rounded corners.

15. The process of claim 14 wherein the DC bias voltage of the first etch step is between about $-210$ and $-250$ volts, the DC bias voltage of the second etch step is between about $-300$ and $-400$ volts and the power of the third etch step is about 400 W.

* * * * *